(12) United States Patent
Gu et al.

(10) Patent No.: US 11,765,930 B2
(45) Date of Patent: Sep. 19, 2023

(54) DISPLAY SUBSTRATE AND METHOD FOR MANUFACTURING THE SAME

(71) Applicant: BOE TECHNOLOGY GROUP CO., LTD., Beijing (CN)

(72) Inventors: Renquan Gu, Beijing (CN); Can Wang, Beijing (CN); Haitao Huang, Beijing (CN); Libo Wang, Beijing (CN); Yang Yue, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 139 days.

(21) Appl. No.: 17/332,834

(22) Filed: May 27, 2021

(65) Prior Publication Data
US 2022/0029128 A1 Jan. 27, 2022

(30) Foreign Application Priority Data
Jul. 24, 2020 (CN) .......................... 202010722716.8

(51) Int. Cl.
*H10K 50/844* (2023.01)
*G02F 1/1335* (2006.01)
(Continued)

(52) U.S. Cl.
CPC ..... *H10K 50/844* (2023.02); *G02F 1/133526* (2013.01); *H10K 50/858* (2023.02); *H10K 71/00* (2023.02); *G02F 1/133519* (2021.01)

(58) Field of Classification Search
CPC ............. H01L 27/322; G02F 1/133603; G02F 1/133504; G02F 1/133519; H10K 50/844; H10K 50/858
See application file for complete search history.

(56) References Cited

U.S. PATENT DOCUMENTS

| 2009/0146237 A1* | 6/2009 | Yun | ............... | H01L 27/14685 257/E31.127 |
| 2011/0205410 A1* | 8/2011 | Ahn | ............... | H01L 27/14621 348/E5.091 |
| 2013/0093036 A1* | 4/2013 | Huang | ............... | H01L 27/14645 438/70 |

FOREIGN PATENT DOCUMENTS

CN 110828517 A 2/2020
CN 110875369 A 3/2020
(Continued)

OTHER PUBLICATIONS

Translation of JP2004-317602 A (Mori Yoshiaki) priority date Dec. 21, 2016, (Year: 2016).*
(Continued)

*Primary Examiner* — Jay C Chang
*Assistant Examiner* — Mikka Liu
(74) *Attorney, Agent, or Firm* — HOUTTEMAN LAW LLC

(57) ABSTRACT

The present disclosure relates to the field of display technology, and provides a display substrate and a method for manufacturing the same. The display substrate includes: a light-emitting substrate comprising a plurality of light-emitting regions which are arranged in parallel with a light propagation direction, and each light-emitting region is provided with a light-emitting layer; a defining layer provided on the light-emitting substrate and including a plurality of hollow-out portions, and the hollow-out portions correspond to the light-emitting regions one to one; and a plurality of micro-lenses provided in the hollow-out portions in a one-to-one correspondence manner. With the present disclosure, it is possible to prevent damage to an underlying light-emitting substrate when forming the micro-lenses and to enhance the stability of the micro-lenses.

13 Claims, 2 Drawing Sheets

(51) Int. Cl.
*H10K 50/858* (2023.01)
*H10K 71/00* (2023.01)

(56) References Cited

FOREIGN PATENT DOCUMENTS

CN 111276515 A 6/2020
JP 2012216454 A 11/2012

OTHER PUBLICATIONS

Mori Yoshiaki (Dec. 21, 2016) JP 2004-317502 A. (Year: 2016).*
China Patent Office, CN202010722716.8 First Office Action dated Nov. 21, 2022.

* cited by examiner

DISPLAY SUBSTRATE AND METHOD FOR MANUFACTURING THE SAME

CROSS REFERENCE TO RELATED APPLICATIONS

The present disclosure claims the priority to Chinese patent application No. 202010722716.8 filed at the Chinese Intellectual Property Office on Jul. 24, 2020, the disclosure of which is incorporated herein by reference in its entirety.

TECHNICAL FIELD

The present disclosure relates to the field of display technology, and in particular, to a display substrate and a method for manufacturing the same.

BACKGROUND

The AR (Augmented Reality) technology is a technology for calculating a position and an angle of an image shot by a camera in real time and adding a corresponding image, and is a new technology for "seamlessly" integrating real world information and virtual world information, and the technology aims to insert the virtual world in the real world on a screen and perform interaction. With the development of AR technology, the requirement on hardware is higher and higher, for example, high-end products usually need to be light and thin by using optical waveguide technology, so as to be convenient for carrying and use. Silicon-based OLEDs (Organic Light-Emitting Diodes) have the advantages of self-luminescence and light and thin, they can meet the need for AR to be easy to carry.

SUMMARY

An embodiment of the present disclosure provides a display substrate, including: a light-emitting substrate, which includes a plurality of light-emitting regions which are arranged in parallel with a light propagation direction, and each light-emitting region is provided with a light-emitting layer; a defining layer provided on the light-emitting substrate and including a plurality of hollow-out portions, and the hollow-out portions correspond to the light-emitting regions one to one; and a plurality of micro-lenses provided in the hollow-out portions in a one-to-one correspondence manner.

In some implementations, the display substrate further includes:
a first planarization layer provided on a side of the light-emitting layer proximal to the defining layer; and
a second planarization layer provided on a side of the defining layer away from the first planarization layer and completely covering the micro-lenses.

In some implementations, a refractive index of the first planarization layer, a refractive index of each of the micro-lenses, a refractive index of the second planarization layer, a curvature radius of each of the micro-lenses, a focal length of each of the micro-lenses, and an aperture of each of the micro-lenses satisfy the following conditions:

$$r \geq \frac{D}{2};$$

$$\frac{n_2 - n_3}{n_1} \geq \frac{D}{2f};$$

where $n_1$ is the refractive index of the first planarization layer; $n_2$ is the refractive index of each of the micro-lenses; $n_3$ is the refractive index of the second planarization layer; r is the curvature radius of each of the micro-lenses; f is the focal length of each of the micro-lenses; and D is the aperture of each of the micro-lenses.

In some implementations, a material of the micro-lenses includes a negative photoresist.

In some implementations, a material of the defining layer includes a metal oxide.

In some implementations, the metal oxide includes indium tin oxide or indium gallium zinc oxide.

In some implementations, the display substrate further includes a color filter substrate provided between the light-emitting substrate and the first planarization layer, where the color filter substrate includes a plurality of color filter regions, each of the color filter regions has a color filter layer disposed thereon, and color filter layers are provided in a one-to-one correspondence with light-emitting layers.

In some implementations, the display substrate further includes a plurality of color filter layers, the color filter layers are in a one-to-one correspondence with the light-emitting layers and are located on a side of the first planarization layer away from the defining layer, and the color filter layers are located on a side of the light-emitting substrate opposite to the light-emitting layer.

An embodiment of the present disclosure provides a display device, including the display substrate described above.

An embodiment of the present disclosure provides a method for manufacturing a display substrate, including:
forming a defining layer on a side of a light-emitting substrate; the light-emitting substrate includes a plurality of light-emitting regions which are arranged in parallel with a light propagation direction, each light-emitting region is provided with a light-emitting layer, the defining layer includes a plurality of hollowed-out portions, the hollowed-out portions are in a one-to-one correspondence with the light-emitting regions, and the defining layer is located on a side of the light-emitting substrate away from light-emitting layers; and
forming micro-lenses in the hollow-out portions such that the micro-lenses are in a one-to-one correspondence with the light-emitting regions.

In some implementations, the forming the defining layer on the side of the light-emitting substrate includes:
depositing an entire film layer on the side of the light-emitting substrate; and
patterning the entire film layer to obtain the defining layer including the plurality of hollow-out portions, where the hollow-out portions are in a one-to-one correspondence with the light-emitting regions.

In some implementations, the forming the micro-lenses in the hollow-out portions such that the micro-lenses are in the one-to-one correspondence with the light-emitting regions includes:
forming an entire layer of micro-lens base layer on the side of the light-emitting substrate; where the micro-lens base layer completely covers the defining layer, and a thickness of the micro-lens base layer is greater than or equal to that of each micro-lens;

forming a micro-lens mask layer on a side of the micro-lens base layer away from the defining layer, where the micro-lens mask layer includes a plurality of micro-lens masks, and the micro-lens masks are in a one-to-one correspondence with the light-emitting regions; and etching the micro-lens mask layer, and etching the micro-lens base layer by taking the micro-lens mask layer as a mask until reaching the defining layer so as to obtain the plurality of micro-lenses, where the micro-lenses are in a one-to-one correspondence with the light-emitting regions.

In some implementations, the forming the micro-lens mask layer on the side of the micro-lens base layer away from the defining layer includes:

forming an entire reflow layer on the side of the micro-lens base layer away from the defining layer, where the entire reflow layer completely covers the micro-lens base layer;

patterning the entire reflow layer to obtain a plurality of sub-reflow-layers such that the sub-reflow-layers are in a one-to-one correspondence with the light-emitting regions; and performing a thermal reflow on the sub-reflow-layers to form micro-lens masks corresponding the sub-reflow-layers in a one-to-one correspondence manner, so that the micro-lens masks are in a one-to-one correspondence with the light-emitting regions, and the micro-lens mask layer including the plurality of micro-lens masks is formed.

DETAILED DESCRIPTION

Figure 1:
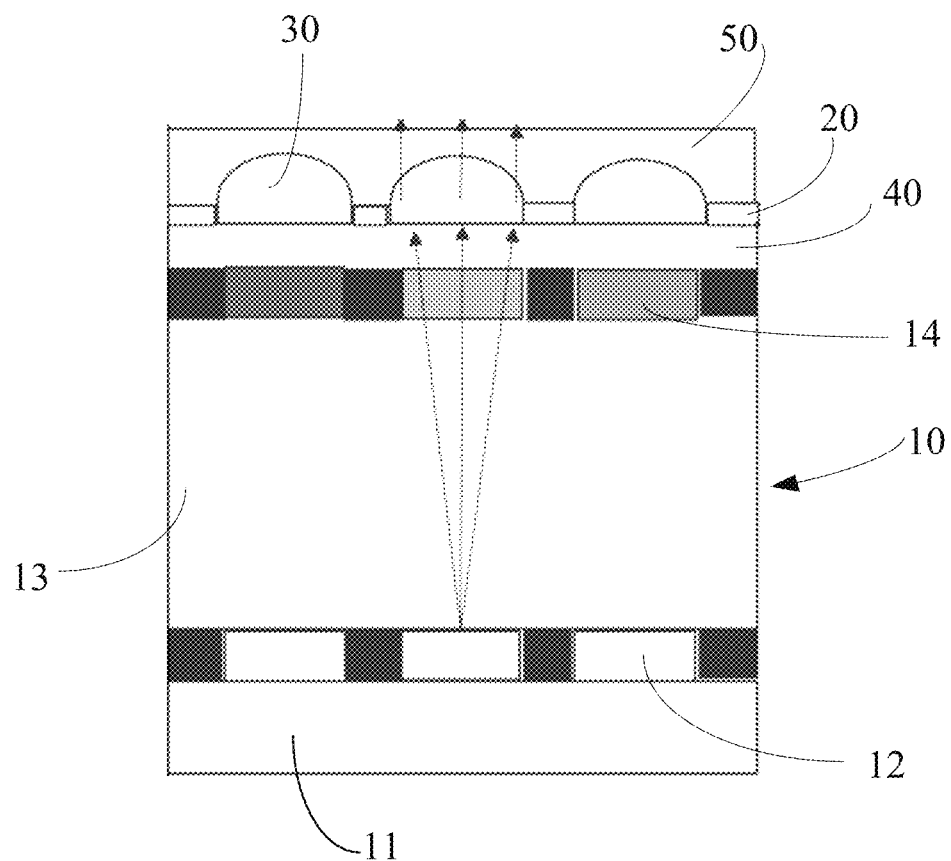
FIG. 1 is a partial schematic diagram of a cross-sectional structure of a display substrate according to an embodiment of the present disclosure.

Reference will now be made in detail to the present disclosure, examples of which are illustrated in the accompanying drawings, where like reference numerals refer to the same or similar elements or elements having the same or similar functions throughout. In addition, if a detailed description of known technologies is not necessary for illustrating the features of the present disclosure, it is omitted. The embodiments described below with reference to the accompanying drawings are illustrative only for the purpose of explaining the present disclosure, and are not to be construed as limiting the present disclosure.

It will be understood by those skilled in the art that, unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the related art and will not be interpreted in an idealized or overly formal sense unless expressly so defined herein.

As used herein, the singular forms "a", "an" and "the" are intended to include the plural forms as well, unless the context clearly indicates otherwise. It will be understood that when an element is referred to as being "connected" or "coupled" to another element, it may be directly connected or coupled to the other element or intervening elements may be present. Further, "connected" or "coupled" as used herein may include wirelessly connected or wirelessly coupled. As used herein, the term "and/or" includes all or any element and all combinations of one or more of the associated listed items.

In the related art, the optical waveguide technology has a large loss of luminance to light, and requires a device with high luminance larger than 3000 nit. However, the luminance of silicon-based OLED is relatively low (which is less than 1500 nit, 1 nit=1 candela/m$^2$ [cd/m$^2$], a luminous intensity per unit area, indicating intensity of the reflected light from an object seen by the eye from a certain direction), which cannot meet the needs for high luminance of AR.

The following describes the technical solutions of the present disclosure and how the technical solutions to solve the above technical problems in detail with specific embodiments in conjunction with the accompanying drawings.

In order to improve the luminance of the display device, in an embodiment of the present disclosure, a micro-lens is disposed on a light-exiting surface of a light-emitting substrate, and factors that affect the luminance improvement effect of the micro-lens on the display substrate are analyzed and studied, and as a result, it is found that: firstly, the larger the ratio of an orthographic projection of the light-emitting layer of the light-emitting region on a plane parallel to the base to an orthographic projection of the micro-lens on the plane is (on the premise that the light-emitting layer and the micro-lens are in one-to-one correspondence), the better the luminance improvement effect is; secondly, the more the alignment between the micro-lens and the light-emitting layer is, the better the luminance improvement effect is, and a distance between the micro-lens and the light-emitting layer is set as: a distance between a light-incident surface of the micro-lens and the light-exiting surface of the light-emitting layer is equal to a focal length of the micro-lens, and in such case, the luminance improvement effect is good; thirdly, refractive indexes between the micro-lens and an upper layer and a lower layer of the micro-lens need to satisfy a certain relation so as to avoid total reflection which can reduce the luminance improvement effect; and fourthly, a shape and a transmittance of the micro-lens also affect the luminance improvement effect to a certain extent, for example, the rougher the surface of the micro-lens is, the poorer the luminance improvement effect is, the higher the transmittance of the micro-lens is, the better the luminance improvement effect is (generally, the transmittance of the micro-lens is more than 90%), where a thickness of the micro-lens is less than or equal to a curvature radius of the micro-lens (it can be understood that the curved surface of the micro-lens is in a hemispherical shape or a spherical cap shape with a central angle less than 180°), and the like.

Based on the above research results, an embodiment of the present disclosure provides a display substrate, and FIG. 1 is a partial schematic diagram of a cross-sectional structure of the display substrate provided in the present embodiment, as shown in FIG. 1, the display substrate may include a light-emitting substrate 10, a defining layer 20, and a plurality of micro-lenses 30. The light-emitting substrate 10 may include a plurality of light-emitting regions, and each light-emitting region may have a light-emitting layer 12 disposed thereon. The defining layer 20 may be disposed on the light-emitting substrate 10, and includes a plurality of hollow-out portions, where the hollow-out portions are disposed in one-to-one correspondence with the light-emitting regions; the micro-lenses 30 are provided in the respective hollow-out portions in a one-to-one correspondence.

Here, taking the OLED-based light-emitting substrate 10 as an example, the micro-lenses 30 may be directly disposed on an encapsulation layer 13 of the light-emitting substrate 10. As shown in FIG. 1, the light-emitting substrate 10 further includes color filter layers 14 and a planarization layer, and the micro-lenses 30 may be disposed on the planarization layer 40 that is above the color filter layers 14 (if the planarization layer is not provided, the micro-lenses 30 may be disposed on the color filter layers 14). It should be noted that the present embodiment is not limited to the OLED-based light-emitting substrate 10, and an LCD-based light-emitting substrate 10 may be employed, as long as the display luminance can be improved by the micro-lenses 30, which also falls within the protection scope of the present disclosure. Specifically, a color filter substrate may be further disposed on the LCD-based light-emitting substrate 10, and the color filter substrate includes color filter regions and a planarization layer located on a side of the color filter regions away from the light-emitting substrate. The micro-lenses 30 may be disposed on the planarization layer. Each color filter region may be provided with one the color filter layer 14, and the color filter layers 14 are provided in one-to-one correspondence with the light-emitting layers 12.

The light-emitting region can be understood as a region of the display substrate divided along a direction perpendicular to the light-emitting layers 12, and an orthographic projection of any point in a same light-emitting region on a plane where the light-emitting layer 12 is located is within an orthographic projection of the light-emitting layer 12 on the plane. It is understood that, as shown in FIG. 1, the light-emitting substrate 10 may further include a base substrate 11 and a black matrix, and the black matrix may be disposed between two adjacent light-emitting layers 12 to define shapes and positions of the light-emitting layers 12. The defining layer 20 may further include a connection portion connecting any two adjacent hollow-out portions.

Figure 2:
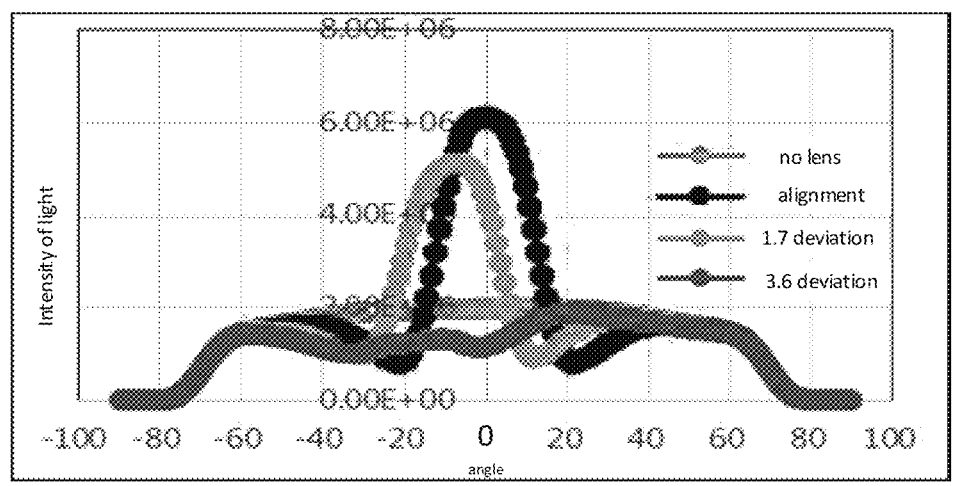
FIG. 2 is a diagram illustrating test results for verifying luminance enhancement effect of a micro-lens on a display substrate according to an embodiment of the present disclosure.

In order to verify the luminance improvement effect of the micro-lenses 30 on the display substrate, a light intensity (light intensity is in direct proportion to the luminance) comparison experiment is performed on the display substrate provided in the present embodiment and three other samples, and as shown in FIG. 2, when the micro-lenses 30 and the light-emitting regions are arranged in a one-to-one correspondence manner (i.e., according to the technical solution of the present disclosure), the luminance improvement effect of the micro-lenses 30 on the display substrate is optimal, and the larger the deviation of the micro-lenses from the light-emitting layer is, the worse the luminance improvement effect is, and the luminance of the display substrate is even reduced after the deviation reaches a certain degree (because when the alignment deviation of the micro-lenses 30 is too large, a part of light is incident on the defining layer 20 or is reflected for multiple times on the curved surface inside the micro-lenses 30, not only the effect of improving the luminance cannot be achieved, but also the energy of the light may be consumed, so that the luminance is reduced).

In the display substrate provided in the present embodiment, the defining layer 20 is disposed on a side of the light-emitting substrate 10 where the micro-lenses 30 are disposed, and the defining layer 20 includes a plurality of hollow-out portions, the hollow-out portions may be disposed in a one-to-one correspondence with the light-emitting regions, and the micro-lenses 30 may be disposed in the hollow-out portions respectively, so that the connection portion between two adjacent hollow-out portions may define boundary of each micro-lens 30 when the micro-lens 30 is formed, the micro-lenses 30 may correspond to the light-emitting regions one-to-one, and it is ensured that light emitted by the light-emitting layers 12 is incident into the micro-lenses 30 as much as possible, which not only enhances stability of the micro-lenses 30, but also enhances the luminance improvement effect of the micro-lenses 30 on the display substrate. The connection portion of the defining layer 20 can also protect the light-emitting substrate 10 when the micro-lenses 30 are formed, so as to prevent the light-emitting substrate 10 from being damaged during the formation of the micro-lenses 30.

In an implementation of the embodiment of the present disclosure, the light-emitting substrate 10 may further include a first planarization layer 40, the first planarization layer 40 is disposed above the color filter layers 14, and the defining layer 20 is disposed on the first planarization layer 40 to ensure that the micro-lenses 30 are formed on a flat surface, and ensure that the light emitted from the micro-lenses 30 is emitted in a direction perpendicular to the base substrate 11 as much as possible. The display substrate may further include a second planarization layer 50, the second planarization layer 50 is disposed on the defining layer 20 and completely covers the micro-lenses 30 to protect the micro-lenses 30 so as to continue to form other structures (such as a polarizer, a touch panel lamp) on the micro-lenses 30.

Further, according to the above analysis and research results of the factors affecting the luminance improvement effect of the micro-lenses 30 on the display substrate, a refractive index of the first planarization layer 40, a refractive index of the micro-lens 30, a refractive index of the second planarization layer 50, a curvature radius of each micro-lens 30, a focal length of each micro-lens 30, and an aperture of each micro-lens 30 may be designed to satisfy the following conditions, so as to prevent the light from being totally reflected at an interface between the first planarization layer 40 and each micro-lens 30 and an interface between each micro-lens 30 and the second planarization layer 50, and further prevent the luminance improvement effect from being reduced due to the total reflection of the light:

$$r \geq \frac{D}{2};$$

$$\frac{n_2 - n_3}{n_1} \geq \frac{D}{2f},$$

where $n_1$ is the refractive index of the first planarization layer 40; $n_2$ is the refractive index of each micro-lens 30; $n_3$ is the refractive index of the second planarization layer 50; r is the curvature radius of each micro-lens 30; f is the focal length of each micro-lens 30; and D is the aperture of each micro-lens 30. Specifically, it may be designed that $n_2$ is greater than or equal to $n_1$, and $n_2$ is greater than $n_3$, so that the final light exiting direction is as close to the direction perpendicular to the base substrate 11 as possible, and the luminance improvement effect of the micro-lenses 30 on the display substrate is enhanced. In order to further enhance the luminance improvement effect of the micro-lenses 30, the shape (the curvature radius, the aperture size, etc.) of each micro-lens 30 may be designed such that the focal points of the micro-lenses 30 are located exactly on the light-emitting layer 12.

In another implementation of the embodiment of the present disclosure, according to the above conditions, the larger $n_2$ is better, so the material of the micro-lens 30 may be preferably an organic material with a higher refractive index (compared to other materials suitable for manufacturing the micro-lens 30), such as a negative photoresist, and since the negative photoresist generally has a higher hardness and a longer lifetime, a material that can increase refractive index may be added to the negative photoresist to further increase the refractive index of the micro-lens 30.

In another implementation of the embodiment of the present disclosure, the material of the defining layer 20 includes metal oxide, and the defining layer 20 is made of inorganic material, which has an etching ratio that is very different from those of the micro-lens 30 and the first planarization layer 40, which are made of organic material, with respect to a same etching gas, so that the first planarization layer 40 can be effectively protected from being etched when the micro-lens 30 is formed. The material of the defining layer 20 is preferably a transparent material such as indium tin oxide or indium gallium zinc oxide.

Based on the same concept as the display substrate, an embodiment of the present disclosure further provides a method for manufacturing the display substrate, which may include the following steps: forming the defining layer 20 on the light-emitting substrate 10, where the light-emitting substrate 10 includes a plurality of light-emitting regions, each of the light-emitting regions is provided with a light-emitting layer 12, the defining layer 20 includes a plurality of hollow-out portions, and the hollow-out portions are arranged in one-to-one correspondence with the light-emitting regions; micro-lenses 30 are formed in the hollow-out portions, so that the micro-lenses 30 corresponds to the light-emitting regions one to one.

In an implementation of the embodiment of the present disclosure, the forming the defining layer 20 on the light-emitting substrate 10 further includes the following steps: depositing an entire film layer on the light-emitting substrate 10; patterning the entire film layer to obtain the defining layer 20 including a plurality of hollow-out portions, and the hollow-out portions are in one-to-one correspondence with the light-emitting regions. The deposition of the entire film layer may be, but not limited to be achieved by using a physical vapor deposition method, the patterning the entire film layer may be, but not limited to be achieved by adopting an etching process using a suitable mask, so that the hollow-out portions of the defining layer 20 can correspond to the light-emitting regions one to one. Meanwhile, the material of the entire film layer may be a metal oxide, and more specifically, may be a transparent material such as indium tin oxide or indium gallium zinc oxide.

In another implementation of the embodiment of the present disclosure, the forming the micro-lenses 30 in the hollow-out portions so that the micro-lenses 30 correspond to the light-emitting regions one to one further includes the following steps:

forming an entire layer of a micro-lens base layer 31 on the light-emitting substrate 10 on which the defining layer 20 is formed; where, the micro-lens base layer 31 completely covers the defining layer 20, and a thickness of the micro-lens base layer 31 is greater than or equal to a thickness of the micro-lens 30;

forming a micro-lens mask layer on the micro-lens base layer 31; where, the micro-lens mask layer includes a plurality of micro-lens masks 32, and the micro-lens masks 32 correspond to the light-emitting regions one to one; and etching the micro-lens mask layer, and etching the micro-lens base layer 31 by using the micro-lens mask layer as a mask until reaching the defining layer 20 to obtain a plurality of micro-lenses 30, where the micro-lenses 30 correspond to the light-emitting regions one to one.

Figure 3:
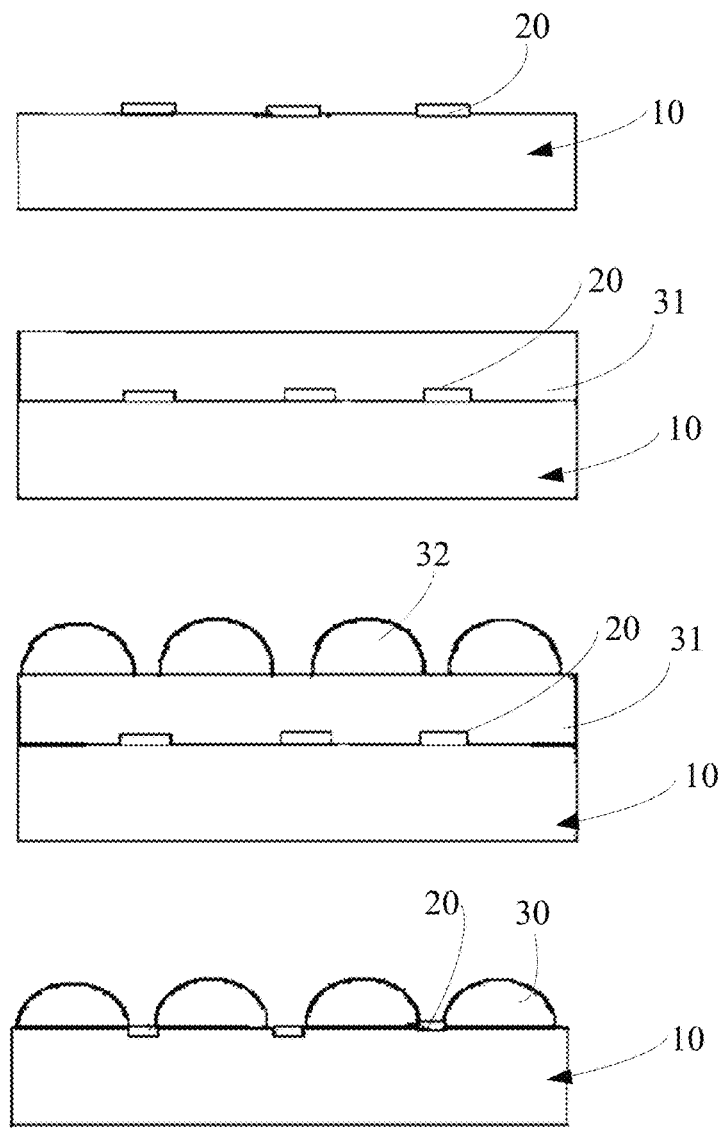
FIG. 3 is a schematic flow chart of a method for manufacturing a display substrate according to an embodiment of the present disclosure.

In the present embodiment, as shown in FIG. 3, after the defining layer 20 is obtained by patterning, a negative photoresist may be coated on the light-emitting substrate 10 to a certain thickness to ensure that the micro-lenses 30 with target size are formed later. After the negative photoresist is coated, the negative photoresist may be subjected to ultraviolet irradiation and baking to cure the negative photoresist, so as to form the entire micro-lens base layer 31. The micro-lens mask layer, which may include a plurality of micro-lens masks 32, may then be formed on the micro-lens base layer 31 through a thermal reflow process, with the micro-lens masks 32 are in one-to-one correspondence to the light-emitting regions. Then, a plurality of micro-lenses 30 can be obtained by an etching process using the micro-lens mask layer as a mask, and the micro-lenses 30 correspond to the light-emitting regions one to one. The micro-lens masks 32 are used as masks to etch a front surface of the micro-lens base layer 31, so that the micro-lenses 30 corresponding to the light-emitting layers 12 one to one can be formed right above the light-emitting layers 12, the problem of poor stability in the process of manufacturing the micro-lenses 30 by adopting a thermal reflow process is solved, the damage to the lower layer in the etching process is prevented, the temperature of the manufacturing process of the micro-lenses 30 is reduced, and the damage to the service life of the display substrate can be reduced.

In some implementations, the forming the micro-lens mask layer on the micro-lens base layer 31 may include: forming an entire reflow layer on the micro-lens base layer 31; where, the entire reflow layer completely covers the micro-lens base layer 31; patterning the entire reflow layer to obtain a plurality of sub-reflow-layers such that the sub-reflow-layers correspond to the light-emitting regions one to one; performing a thermal reflow on the sub-reflow-layers, so that each sub-reflow-layer forms a micro-lens mask 32, and the respective micro-lens masks 32 correspond one-to-one to the respective light-emitting regions to form the micro-lens mask layer including the plurality of micro-lens masks 32.

In a specific implementation of the embodiment of the present disclosure, the light-emitting substrate 10 may further include a first planarization layer 40, the first planarization layer 40 is formed on the color filter layer 14, and a defining layer 20 is formed on the first planarization layer 40 to ensure that the micro-lenses 30 are formed on a flat surface, and ensure that the light emitted from the micro-lenses 30 is emitted in a direction perpendicular to the base substrate 11 as much as possible.

In a specific implementation of the embodiment of the present disclosure, the method for manufacturing the display substrate may further include: forming a second planarization layer 50 on the micro-lenses 30 and the defining layer 20, where the second planarization layer 50 completely covers the micro-lenses 30, the micro-lenses 30 can be protected so as to continue to form other structures (e.g., a polarizer, a touch panel lamp) on the micro-lenses 30.

In a specific implementation of the embodiment of the present disclosure, the refractive index of the first planarization layer 40, the refractive index of each micro-lens 30, the refractive index of the second planarization layer 50, the curvature radius of each micro-lens 30, the focal length of each micro-lens 30, and the aperture of each micro-lens 30 may be designed to satisfy the following conditions, so as to prevent the light from being totally reflected at the interface between the first planarization layer 40 and each micro-lens 30 and the interface between each micro-lens 30 and the second planarization layer 50, and further prevent the luminance improvement effect from being reduced due to the total reflection of the light:

$$r \geq \frac{D}{2};$$

$$\frac{n_2 - n_3}{n_1} \geq \frac{D}{2f};$$

where $n_1$ is the refractive index of the first planarization layer 40; $n_2$ is the refractive index of each micro-lens 30; $n_3$ is the refractive index of the second planarization layer 50; r is the curvature radius of each micro-lens 30; f is the focal length of each micro-lens 30; and D is the aperture of each micro-lens 30. Specifically, it may be designed that $n_2$ is greater than or equal to $n_1$, and $n_2$ is greater than $n_3$, so that the final light exiting direction is as close to the direction perpendicular to the base substrate 11 as possible, and the luminance improvement effect of the micro-lenses 30 on the display substrate is enhanced. In order to further enhance the luminance improvement effect of the micro-lenses 30, the shape (the curvature radius, the aperture size, etc.) of each micro-lens 30 may be designed such that the focal points of the micro-lenses 30 are located exactly on the light-emitting layer 12.

In another implementation of the embodiment of the present disclosure, according to the above conditions, the larger $n_2$ is better, so the material of the micro-lens 30 may be preferably an organic material with a higher refractive index (compared to other materials suitable for manufacturing the micro-lens 30), such as a negative photoresist (organic material), and since the negative photoresist generally has a higher hardness and a longer lifetime, a material that can increase refractive index may be added to the negative photoresist to further increase the refractive index of the micro-lens 30.

In another implementation of the embodiment of the present disclosure, the defining layer 20 may be made of metal oxide, and the defining layer 20 is made of inorganic material, which has an etching ratio that is very different from those of the micro-lens 30 and the first planarization layer 40, which are made of organic material, with respect to a same etching gas, so that the first planarization layer 40 can be effectively protected from being etched when the micro-lens 30 is formed. The material of the defining layer 20 is preferably a transparent material such as indium tin oxide or indium gallium zinc oxide.

Figure 4:
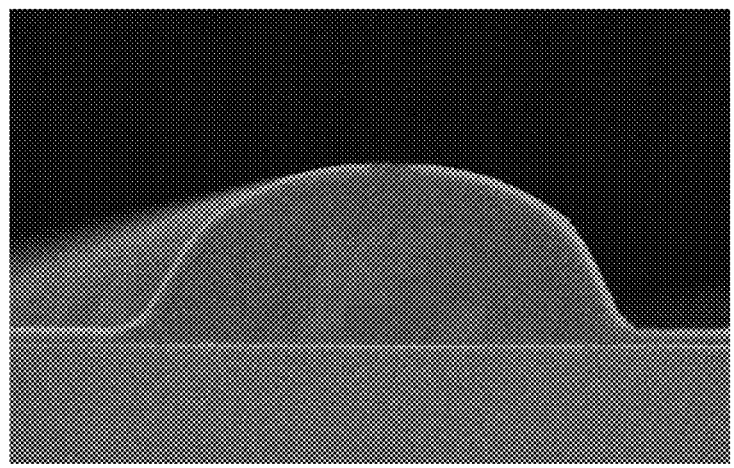
FIG. 4 is an image of a micro-lens of a display substrate under an electron scanning microscope according to an embodiment of the present disclosure.

As a result of observing the display substrate manufactured in the embodiment of the present disclosure by using an electron scanning microscope, as shown in FIG. 4, when the micro-lenses 30 are formed, the defining layer 20 protects the light-emitting substrate 10 well, and the light-emitting substrate 10 is not damaged.

According to the method for manufacturing the display panel provided by the embodiment of the present disclosure, the defining layer 20 including the hollow-out portions may be formed on the light-emitting substrate 10 first, and the hollow-out portions may be disposed in one-to-one correspondence with the light-emitting regions, so that the micro-lenses 30 are disposed in the hollow-out portions of the defining layer 20 respectively, so as to achieve one-to-one correspondence between the micro-lenses 30 and the light-emitting regions, and ensure that light emitted by the light-emitting layers 12 is incident on the micro-lenses 30 as much as possible, thereby not only enhancing the stability of the micro-lenses 30, but also enhancing the luminance improvement effect of the micro-lenses 30 on the display substrate. The defining layer 20 can also protect the underlying light-emitting substrate 10 when the micro-lenses 30 are formed, so as to prevent the light-emitting substrate 10 from being damaged during the formation of the micro-lenses 30.

Those of skill in the art will appreciate that the various operations, methods, steps, measures, solutions of process that have been discussed in the present disclosure may be alternated, modified, combined, or eliminated.

In the description of the present disclosure, it is to be understood that the terms "center", "on", "under", "front", "rear", "left", "right", "vertical", "horizontal", "top", "bottom", "inner", "outer", and the like indicate orientations or positional relationships based on those shown in the drawings, merely for convenience in describing the present disclosure and simplifying the description, and do not indicate or imply that the device or element referred to must have a particular orientation, be constructed in a particular orientation, and operate, and therefore, should not be construed as limiting the present disclosure.

The foregoing is only a few implementations of the present disclosure, and it should be noted that modifications and embellishments could be made by those skilled in the art without departing from the principle of the present disclosure, which should be considered as falling into the scope of the present disclosure.

The invention claimed is:

1. A display substrate, comprising:
a light-emitting substrate, which comprises a plurality of light-emitting regions arranged in parallel with a light propagation direction, and each light-emitting region is provided with a light-emitting layer;
a defining layer provided on the light-emitting substrate and comprising a plurality of hollow-out portions, and the hollow-out portions correspond to the light-emitting regions one to one;
a plurality of micro-lenses provided in the hollow-out portions in a one-to-one correspondence manner;
a first planarization layer provided on a side of the light-emitting layer close to the defining layer; and
a second planarization layer provided on a side of the defining layer away from the first planarization layer and completely covering the micro-lenses, wherein
a refractive index of the first planarization layer, a refractive index of each of the micro-lenses, a refractive index of the second planarization layer, a curvature radius of each of the micro-lenses, a focal length of each of the micro-lenses, and an aperture of each of the micro-lenses satisfy the following conditions:

$$r \geq \frac{D}{2};$$

$$\frac{n_2 - n_3}{n_1} \geq \frac{D}{2f};$$

where n1 is the refractive index of the first planarization layer; n2 is the refractive index of each of the micro-lenses; n3 is the refractive index of the second planarization layer; r is the curvature radius of each of the micro-lenses; f is the focal length of each of the micro-lenses; and D is the aperture of each of the micro-lenses.

2. The display substrate of claim 1, wherein a material of the micro-lenses comprises a negative photoresist.

3. The display substrate of claim 1, wherein a material of the defining layer comprises a metal oxide.

4. The display substrate of claim 3, wherein the metal oxide comprises indium tin oxide or indium gallium zinc oxide.

5. The display substrate of claim 1, further comprising a color filter substrate provided between the light-emitting substrate and the first planarization layer, wherein the color filter substrate comprises a plurality of color filter regions, each of the color filter regions has a color filter layer disposed thereon, and color filter layers are provided in a one-to-one correspondence with the light-emitting layers.

6. The display substrate of claim 1, further comprising a color filter substrate provided between the light-emitting substrate and the first planarization layer, wherein the color filter substrate comprises a plurality of color filter regions, each of the color filter regions has a color filter layer disposed thereon, and color filter layers are provided in a one-to-one correspondence with the light-emitting layers.

7. The display substrate of claim 1, wherein the light-emitting substrate further comprises a plurality of color filter layers, the color filter layers are in a one-to-one correspondence with the light-emitting layers and are located on a side of the first planarization layer away from the defining layer, and the plurality of color filter layers are located on a side of the light-emitting substrate opposite to the light-emitting layer.

8. The display substrate of claim 1, wherein the light-emitting substrate further comprises a plurality of color filter layers, the color filter layers are in a one-to-one correspondence with the light-emitting layers and are located on a side of the first planarization layer away from the defining layer, and the plurality of color filter layers are located on a side of the light-emitting substrate opposite to the light-emitting layer.

9. A display device, comprising the display substrate of claim 1.

10. A method for manufacturing a display substrate, comprising:
forming a defining layer on a side of a light-emitting substrate; the light-emitting substrate comprises a plurality of light-emitting regions which are arranged in parallel with a light propagation direction, each light-emitting region is provided with a light-emitting layer, the defining layer comprises a plurality of hollowed-out portions, the hollowed-out portions are in a one-to-one correspondence with the light-emitting regions, and the defining layer is located on a side of the light-emitting substrate away from the light-emitting layers; and
forming micro-lenses in the hollow-out portions such that the micro-lenses are in a one-to-one correspondence with the light-emitting regions,
forming a first planarization layer provided on a side of the light-emitting layer close to the defining layer; and
forming a second planarization layer provided on a side of the defining layer away from the first planarization layer and completely covering the micro-lenses, wherein
a refractive index of the first planarization layer, a refractive index of each of the micro-lenses, a refractive index of the second planarization layer, a curvature radius of each of the micro-lenses, a focal length of each of the micro-lenses, and an aperture of each of the micro-lenses satisfy the following conditions:

$$r \geq \frac{D}{2};$$

$$\frac{n_2 - n_3}{n_1} \geq \frac{D}{2f};$$

where n1 is the refractive index of the first planarization layer; n2 is the refractive index of each of the micro-lenses; n3 is the refractive index of the second planarization layer; r is the curvature radius of each of the micro-lenses; f is the focal length of each of the micro-lenses; and D is the aperture of each of the micro-lenses.

11. The method of claim 10, wherein the forming the defining layer on the side of the light-emitting substrate further comprises:
depositing an entire film layer on the side of the light-emitting substrate; and
patterning the entire film layer to obtain the defining layer comprising the plurality of hollow-out portions, wherein the hollow-out portions are in a one-to-one correspondence with the light-emitting regions.

12. The method of claim 10, wherein the forming the micro-lenses in the hollow-out portions such that the micro-lenses are in the one-to-one correspondence with the light-emitting regions further comprises:
forming an entire layer of micro-lens base layer on the side of the light-emitting substrate; wherein the micro-lens base layer completely covers the defining layer, and a thickness of the micro-lens base layer is greater than or equal to that of each micro-lens;
forming a micro-lens mask layer on a side of the micro-lens base layer away from the defining layer, wherein the micro-lens mask layer comprises a plurality of micro-lens masks, and the micro-lens masks are in a one-to-one correspondence with the light-emitting regions; and
etching the micro-lens mask layer, and etching the micro-lens base layer by taking the micro-lens mask layer as a mask until reaching the defining layer so as to obtain the plurality of micro-lenses, wherein the micro-lenses are in a one-to-one correspondence with the light-emitting regions.

13. The method of claim 12, wherein the forming the micro-lens mask layer on the side of the micro-lens base layer away from the defining layer further comprises:
forming an entire reflow layer on the side of the micro-lens base layer away from the defining layer, wherein the entire reflow layer completely covers the micro-lens base layer;
patterning the entire reflow layer to obtain a plurality of sub-reflow-layers such that the sub-reflow-layers are in a one-to-one correspondence with the light-emitting regions; and
performing a thermal reflow on the sub-reflow-layers to form micro-lens masks corresponding the sub-reflow-layers in a one-to-one correspondence manner, so that the micro-lens masks are in a one-to-one correspondence with the light-emitting regions, and the micro-lens mask layer comprising the plurality of micro-lens masks is formed.

* * * * *